(12) United States Patent
Balcerek et al.

(10) Patent No.: US 8,731,853 B2
(45) Date of Patent: May 20, 2014

(54) METHOD FOR FAULT LOCATION ON SERIES COMPENSATED POWER TRANSMISSION LINES WITH TWO-END UNSYNCHRONIZED MEASUREMENT

(75) Inventors: Przemyslaw Balcerek, Cracow (PL);
Marek Fulczyk, Kedzierzyn-Kozle (PL);
Eugeniusz Rosolowski, Wroclaw (PL);
Jan Izykowski, Wroclaw (PL); Murari Saha, Vasteras (SE)

(73) Assignee: ABB Research Ltd., Zurich (CH)

( * ) Notice: Subject to any disclaimer, the term of this patent is extended or adjusted under 35 U.S.C. 154(b) by 570 days.

(21) Appl. No.: 12/738,518

(22) PCT Filed: Oct. 3, 2008

(86) PCT No.: PCT/EP2008/008475
§ 371 (c)(1),
(2), (4) Date: Apr. 16, 2010

(87) PCT Pub. No.: WO2009/049803
PCT Pub. Date: Apr. 23, 2009

(65) Prior Publication Data
US 2011/0082653 A1    Apr. 7, 2011

(30) Foreign Application Priority Data
Oct. 19, 2007    (EP) .................................... 07460030

(51) Int. Cl.
*G01R 31/00* (2006.01)
*G01R 31/08* (2006.01)
(52) U.S. Cl.
USPC .......................................... 702/59; 324/512
(58) Field of Classification Search
USPC ........... 702/59, 57–58, 60, 64–65, 72, 81, 84, 702/127, 182–185, 188–189; 324/500, 509, 324/512, 519, 521–522, 525, 555, 600, 602, 324/609; 703/2, 4, 13, 18
See application file for complete search history.

(56) References Cited

U.S. PATENT DOCUMENTS 5,455,776 A * 10/1995 Novosel .......................... 702/59
5,929,642 A * 7/1999 Philippot et al. .............. 324/522
(Continued)

FOREIGN PATENT DOCUMENTS

WO    2009049803 A1    4/2009

OTHER PUBLICATIONS

HP, "Accurate Transmission Line Fault Location Using Synchronized Sampling" Application Note 1276-1 Printed in U.S.A. Jun. 1996.*

(Continued)

*Primary Examiner* — Toan Le
(74) *Attorney, Agent, or Firm* — Paul R. Katterle; Melissa J. Szczepanik

(57) ABSTRACT

A method for fault location in series compensated power transmission lines using two-end unsynchronized voltage and current measurements in stations A and B. The method includes performing a subroutine I for determining whether the fault occurred in a line section LA between the station A and a SC&MOV and the distance $d_A$ to the fault from station A. Subroutine II determines whether the fault occurred in a line section LB between the station B and the SC&MOV and the distance $d_B$ to the fault from station B. The synchronization angle $e^{j\delta_A}$ is determined in subroutine I, and the synchronization angle $e^{j\delta_B}$ is determined in subroutine II. Then, the distance to fault $d_A$ or $d_B$ is determined. Finally, an equivalent impedance of compensating banks at fault stage $Z_{SC1\_ph}^{SUB\_A}$ and $Z_{SC1\_ph}^{SUB\_B}$, and pre-fault stage $Z_{SC1\_pre}$ is calculated in order to determine whether distance $d_A$ or $d_B$ is the final result.

2 Claims, 5 Drawing Sheets

(56) References Cited

U.S. PATENT DOCUMENTS

| | | | |
|---|---|---|---|
| 6,466,031 B1* | 10/2002 | Hu et al. | 324/522 |
| 6,571,182 B2* | 5/2003 | Adamiak et al. | 702/64 |
| 2003/0155929 A1* | 8/2003 | Choi et al. | 324/509 |
| 2004/0169518 A1* | 9/2004 | Saha et al. | 324/522 |
| 2006/0097728 A1* | 5/2006 | Saha et al. | 324/525 |
| 2006/0142964 A1 | 6/2006 | Saha et al. | |

OTHER PUBLICATIONS

Izykowski et al., Accurate Location of Faults on Power Transmission Lines with Use of Two-End Unsynchronized Measurements, Apr. 2006, IEEE Transactions on Power Delivery, vol. 21, No. 2, pp. 627-633.*

Fecteau C., "Accurate fault location algorithm for series compensated lines using two-terminal unsynchronized measurements and hydro-quebec's field experience," Annual Western Protective Relay Conference, vol. 33, Jan. 1, 2006, pp. 1-16, XP007906022.

Chi-Shan Yu et al., "A New PMU-Based Fault Location Algorithm for Series Compensated Lines," IEEE Transactions on Power Delivery, IEEE Service Center, New York, NY, vol. 17, No. 1, Jan. 1, 2002, p. 34-p. 40, XP011050186.

Javad Sadeh et al.,"Accurate Fault Location Algorithm for Series Compensated Transmission Lines" IEEE Transactions on Power Delivery, IEEE Service Center, New York, NY, vol. 15, No. 3, Jul. 1, 2000, XP011049895.

Dutra R et al.,"Fault location on parallel transmission lines with series compensation," Transmission and Distribution Conference and Exposition: Latin America, 2004 IEEE/PES Sao Paulo, Brazil Nov. 8-11, 2004, Piscataway, NJ, IEEE, Nov. 8, 2004 pp. 591-597, XP010799929.

Chi-Shan Yu et al.,"A new fault location algorithm for series compensated lines using synchronized phasor measurements," Power Engineering Society Summer Meeting 2000. IEEE Jul. 16-20, 2000, Piscataway, NJ, IEEE, vol. 3, Jan. 1, 2000 pp. 1350-1354, XP010511221.

* cited by examiner

METHOD FOR FAULT LOCATION ON SERIES COMPENSATED POWER TRANSMISSION LINES WITH TWO-END UNSYNCHRONIZED MEASUREMENT

BACKGROUND OF THE INVENTION

The present invention is concerned with a method for fault location on series compensated power transmission lines with two-end unsynchronized measurement, finding an application in the electrical power sector and for overhead transmission lines uncompensated and with series compensation.

The location fault technique on series compensated power transmission lines is known from EP1051632B1. In this solution it has been proposed to calculate distance to fault with utilizing local measurements from one terminal of the series compensated transmission line where fault locator is placed. This method makes use of transforming the parallel connection of series capacitor and metal oxide varistor (MOV) into a model—equivalent impedance in the form of a series connection of resistance and reactance, both fundamental current magnitude dependent. This equivalent impedance is used to calculate the distance to fault. This method requires the knowledge of the parameters of series capacitor banks and MOV elements as well.

A method of reach measurement for distance relay and fault locators for series—compensated transmission lines is know from U.S. Pat. No. 6,336,059 B1. In the method according to that invention the fault location estimation is done with using local information only. In the method a number of line currents samples are measured, where such samples are representative of values of line current waveform at successive instants of time on the series compensation line. Capacitor voltage values are computed based on measured currents in accordance with an equation which takes into account the non-linear protection device—metal oxide varistor parallel to the installed series capacitor. The distance to fault is calculated with taking into account the calculated earlier capacitor voltage values.

In US patent 2006/0142964 A1 it is presented the fault location method with using two end currents and voltages measurement. The invention is characterised in that after determination of current transformer saturation at first end of the line A or second end B, the distance to fault is calculated with using voltage from both ends of the line and currents only from this side of the line where current transformers are not saturated. Calculation of distance to fault is done based on generalized fault loop model. In this model the total fault current is determined with use of lumped line model and, one end current signals and two ends voltage signals. However the method according to the cited invention is not designed for locating faults on series compensated lines.

Another method of fault location on series compensation lines with using two-end measurements is known from the article Chi-Shan Yu, Chih-Wen Liu, Sun-Li Yu, and Joe-Air Jiang, "A New PMU-Based Fault Location Algorithm for Series Compensated Lines", IEEE Transactions on Power Delivery, VOL. 17, NO. 1, JANUARY 2002, pp. 33-46. This method uses voltage and current signals measured synchronously at both ends of a single series compensated line. Thus, differs by the kind of measurement (synchronous measurement) and type of a line (single series-compensated line) from the invented approach, which is designed for use of more general case of asynchronous measurements and in application to both single and double-circuit uncompensated and series-compensated lines. Moreover, the cited approach does not provide an analytic formula for the sought distance to fault but is based on scanning along the whole line section for finding the fault position at which the determined fault voltage and total fault current are in phase (this is so since the fault path has the resistive character). For each checked point on the line, the fault voltage and total fault current have to be determined from the symmetrical components of current and voltage. This imposes high computational burden required for performing the fault location. In contrast, the invented approach delivers the compact formula for the sought distance to fault, derived with strict considering the distributed parameter model of the line.

From the article Claude Fecteau "Accurate Fault Location Algorithm for Series Compensated Lines Using Two-Terminal Unsynchronized Measurements and Hydro-Quebec's Field Experience", presented to the 33-rd Annual Western Protective Relay Conference, Spokane, Wash., Oct. 17-10, 2006 Conference there is known the solution that is to a certain extent related with the invented approach. One can point out that the developed approach is more general (single and double-circuit lines, uncompensated and series-compensated lines). The cited approach does not provide an analytic formula for the sought distance to fault. Instead, the distance to fault is determined iteratively by minimizing the objective function for the reactance of the fault impedance. This imposes higher computational burden than the invented approach.

Moreover, the invented approach offers additionally determination of the synchronization angle, in case of single phase-to-ground faults and phase-to-phase faults (majority of the faults in practice), with use of the post-fault quantities. This is advantageous from the assuring precise synchronization point of view.

SUMMARY OF THE INVENTION

The essence of the inventive method for fault location in series compensated power transmission lines with two-end unsynchronized measurement wherein a distance to fault and fault resistance are determined by means of voltages and currents values measurement in the stations A and B, before and after occurrence of the fault, consist of the following:

if the fault occurred in the line section LA between station A and series capacitor and metal oxide varistor device SC&MOV, the distance for fault location $d_A$ is determined by determination of a synchronization angle $\delta A$ in term $e^{j\delta_A}$ for known type of the fault which is phase-to-ground faults or phase-to-phase faults, or which is not the phase-to-ground faults or not the phase-to-phase faults, then taking into account the distributed parameter line model and solving the formula:

$$d_A = p_{SC} d_{LA},$$

where:

$p_{SC}$—denotes the distance (p.u.) per unit of total line length l at which the compensation bank SC&MOV is installed far away from the station A, $d_{LA}$—denotes an hypothetical distance to fault, expressed in relation to length $p_{SC}l$ and which value is received using known iterative method by solving the fault loop formula:

$$\sum_{i=0}^{2} \underline{a}_i \left( \underline{V}_{Ai} \cosh(\underline{\gamma}_{iL} d_{LA} p_{SC} l) - \underline{Z}_{ciL} \underline{I}_{Ai} \sinh(\underline{\gamma}_{iL} d_{LA} p_{SC} l) \right) \cdot e^{j\delta_A} -$$

$$R_{FA} \sum_{i=1}^{2} \frac{\underline{a}_{Fi} \underline{M}_i}{\cosh(\underline{\gamma}_{iL}(1-d_{LA}) p_{SC} l)} = 0$$

for single line, $$\sum_{i=0}^{2} \underline{a}_i \left( \underline{V}_{Ai} \cosh(\underline{\gamma}_{iL} d_{LA} p_{SC} l) - \underline{Z}_{ciL} \underline{I}_{Ai} \sinh(\underline{\gamma}_{iL} d_{LA} p_{SC} l) \right) \cdot e^{j\delta_A} -$$

$$R_{FA} \sum_{i=1}^{2} \frac{\underline{a}_{Fi} \underline{M}_i}{\cosh(\underline{\gamma}_{iL}(1-d_{LA}) p_{SC} l)} - \underline{a}_{m0} d_{LA} p_{SC} \underline{Z}_{0m} \underline{I}_{Aparal\_0} \cdot e^{j\delta_A} = 0$$

for double-circuit line,
in which:
$R_{FA}$—denotes the unknown fault resistance,
$\underline{a}_1, \underline{a}_2, \underline{a}_0, \underline{a}_{m0}$—denotes the weighting coefficients dependent on fault type,
$\underline{M}_i$—denote numerical components for positive and negative sequences,
$\underline{a}_{F1}, \underline{a}_{F2}$—denotes the share coefficients dependent on fault type,
$\underline{Z}_{0m}$—mutual coupling impedance for zero sequence,
$\underline{I}_{Aparal\_0}$—denotes zero sequence current from the station A measured in healthy parallel line,
  then an equivalent impedance of compensating bank at fault stage ($\underline{Z}_{SC1\_ph}^{SUB\_A}$) is calculated with using the post fault of measured voltage and currents and an equivalent impedance of compensation bank at pre-fault ($\underline{Z}_{SC1\_pre}$) is calculated in order to determine the final result $d_A$ which is chosen in the following steps:
  first, it is check whether the fault resistances $R_{FA}$ is of positive value and if not, then such subroutine is rejected,
  next, the features "real" and:"imag" of the estimated equivalent circuit of compensation banks SCs&MOVS are checked and if each of it is satisfied the following dependence:
real($\underline{Z}_{SC1\_ph}^{SUB\_A}$)>0,
imag($\underline{Z}_{SC1\_ph}^{SUB\_A}$)<0,
and imag($\underline{Z}_{SC1\_ph}^{SUB\_A}$)>imag($\underline{Z}_{SC1\_pre}$)
  then
  that the fault has occurred between the station A and the SC&MOV bank, and the result $d_A$ is a valid result.

The essence of the inventive method for fault location in series compensated power transmission lines with two-end unsynchronized measurement wherein a distance to fault and fault resistance are determined by means of voltages and currents values measurement in the stations A and B, before and after occurrence of the fault, consist of the following:
  if the fault occurred in the line section LB between station B and series capacitor and metal oxide varistor device SC&MOV, the distance $d_B$ for fault location id determined by
    determination of a synchronization angle $\delta_B$ in term $e^{j\delta_B}$ for known type of the fault which is phase-to-ground faults or phase-to-phase faults, or which is not the phase-to-ground faults or not the phase-to-phase faults,
    then taking into account the distributed parameter line model and solving the formula:

$$d_B = (1-p_{SC}) d_{LB}$$

where:
$(1-p_{SC})$—denotes the distance (p.u.) per unit of total line length l, at which the compensation bank SC&MOV is installed far away from the station B,
$d_{LB}$—denotes an hypothetical distance to fault, expressed in relation to length $(1-p_{SC}l)$ and which value is received using known iterative method by solving the fault loop formula:

$$\sum_{i=0}^{2} \underline{a}_i \left( \underline{V}_{Bi} \cosh(\underline{\gamma}_{iL} d_{LB}(1-p_{SC}) l) - \underline{Z}_{ciL} \underline{I}_{Bi} \sinh(\underline{\gamma}_{iL} d_{LB}(1-p_{SC}) l) \right) \cdot e^{j\delta_B} -$$

$$R_{FB} \sum_{i=1}^{2} \frac{\underline{a}_{Fi} \underline{M}_i}{\cosh(\underline{\gamma}_{iL}(1-d_{LB})(1-p_{SC}) l)} = 0$$

for single line, $$\sum_{i=0}^{2} \underline{a}_i \left( \underline{V}_{Bi} \cosh(\underline{\gamma}_{iL} d_{LB}(1-p_{SC}) l) - \underline{Z}_{ciL} \underline{I}_{Bi} \sinh(\underline{\gamma}_{iL} d_{LB}(1-p_{SC}) l) \right) \cdot e^{j\delta_B} -$$

$$R_{FB} \sum_{i=1}^{2} \frac{\underline{a}_{Fi} \underline{M}_i}{\cosh(\underline{\gamma}_{iL}(1-d_{LB})(1-p_{SC}) l)} -$$

$$\underline{a}_{m0} d_{LB}(1-p_{SC}) \underline{Z}_{0m} \underline{I}_{Bparal\_0} \cdot e^{j\delta_B} = 0$$

for double-circuit line
where:
$R_{FB}$—denotes the unknown fault resistance,
$\underline{M}_i$—denote numerical coefficients for positive and negative sequences,
$\underline{a}_1, \underline{a}_2, \underline{a}_0, \underline{a}_{m0}$—denotes the weighting coefficients dependent on fault type,
$\underline{a}_{F1}, \underline{a}_{F2}$—denotes the share coefficients dependent on fault type,
$\underline{Z}_{0m}$—mutual coupling impedance for zero sequence,
$\underline{I}_{Bparal\_0}$—denotes zero sequence current from the station B measured in healthy parallel line,
  then an equivalent impedance of compensating bank at fault stage ($\underline{Z}_{SC1\_ph}^{SUB\_B}$) is calculated with using the post fault of measured voltage and currents and an equivalent impedance of compensation bank at pre-fault ($\underline{Z}_{SC1\_pre}$) is calculated in order to determine the final result $d_B$ which is chosen in the following steps:
  first, it is check whether the fault resistances $R_{FB}$ are of positive value and if not, then such subroutine is rejected,
  next, the features "real" and:"imag" of the estimated equivalent circuit of compensation banks SCs&MOVS are checked and if it is satisfied the following dependence:
real($\underline{Z}_{SC1\_ph}^{SUB\_B}$)>0
imag($\underline{Z}_{SC1\_ph}^{SUB\_B}$)<0
and imag($\underline{Z}_{SC1\_ph}^{SUB\_B}$)>imag($\underline{Z}_{SC1\_pre}$)
then that the fault has occurred between the station B and the SC&MOV bank, and the result $d_B$ is a valid result.

Preferably the synchronization angle $\delta_A$ in term $e^{j\delta_A}$ is determined for phase-to-ground faults or phase-to-phase faults from the formula:

$$[e^{j\delta_A}]_{ph-g,ph-ph} = \frac{\underline{a}_{F2}^{I-SET} \underline{I}_{SC2\_B} - \underline{a}_{F1}^{II-SET} \underline{I}_{SC1\_B}}{\underline{a}_{F1}^{II-SET} \underline{N}_{A1} - \underline{a}_{F2}^{I-SET} \underline{N}_{A2}}$$

where:
subscript ph-g denotes phase to ground faults: a-g, b-g, c-g, and subscript ph-ph denotes phase to phase faults a-b, b-c, c-a, $\underline{a}_{F2}^{I-SET}$, $\underline{a}_{F1}^{II-SET}$—denote the coefficients dependent on fault type, $\underline{I}_{SC1\_B}$—denotes the positive sequence current from the station B after analytical transfer towards series capacitor banks SC&MOV, $\underline{I}_{SC2\_B}$—denotes the negative sequence current from the station B after analytical transfer towards series capacitor banks SC&MOV, $\underline{N}_{A1}$, $\underline{N}_{A2}$—denote the coefficients dependent on positive and negative sequence currents and voltage taken at station A respectively as well as parameters of the line.

Preferably synchronization angle $\delta_A$ in term $e^{j\delta_A}$ is determined for the faults nor being the phase-to-ground faults or phase-to-phase faults from the formula:

$$e^{j\delta_A} = \frac{(1+\underline{Z}_{1B}\underline{Y}_{1B})(\underline{Y}_{1B}\underline{V}_{B1}^{pre} - \underline{I}_{B1}^{pre}) + \underline{Y}_{1B}\underline{V}_{B1}^{pre}}{(1+\underline{Z}_{1A}\underline{Y}_{1A})(\underline{I}_{A1}^{pre} - \underline{Y}_{1A}^{pre}\underline{V}_{A1}^{pre}) - \underline{Y}_{1A}\underline{V}_{A1}^{pre}}$$

where:
$\underline{V}_{A1}^{pre}$, $\underline{V}_{B1}^{pre}$—denote pre-fault positive sequence quantities (superscript 'pre' and subscript '1') of voltage measured at the ends A and B, respectively, $\underline{I}_{A1}^{pre}$, $\underline{I}_{B1}^{pre}$—denote pre-fault positive sequence quantities (superscript 'pre' and subscript '1') of current measured of the faulted line at the ends A and B, respectively, $\underline{Z}_{1A}$, $\underline{Y}_{1A}$—denote impedance and admittance of line section LA, $\underline{Z}_{1B}$, $\underline{Y}_{1B}$—denote impedance and admittance of line section LB, LA—is the part of the line between line station A and series capacitor banks LB—is the part of the line between line station B and series capacitor banks.

Preferably synchronization angle $\delta_B$ in term $e^{j\delta_B}$ is determined for phase-to-ground faults or phase-to-phase faults from the formula:

$$[e^{j\delta_B}]_{ph-g,ph-ph} = \frac{\underline{a}_{F2}^{I-SET} \underline{I}_{SC2\_A} - \underline{a}_{F1}^{II-SET} \underline{I}_{SC1\_A}}{\underline{a}_{F1}^{II-SET} \underline{N}_{B1} - \underline{a}_{F2}^{I-SET} \underline{N}_{B2}}$$

where:
$\underline{a}_{F2}^{I-SET}$, $\underline{a}_{F1}^{II-SET}$—denote the coefficients dependent of fault type, $\underline{I}_{SC1\_A}$—denotes positive sequence current from the station A after analytical transfer towards series capacitor banks SC&MOV, $\underline{I}_{SC2\_A}$—denotes negative sequence current from the station A after analytical transfer towards series capacitor banks SC&MOV, $\underline{N}_{B1}$, $\underline{N}_{B2}$—denote the coefficients dependent on positive and negative sequence currents and voltage taken at station B respectively as well as parameters of the line.

Preferably the synchronization angle $\delta_B$ in term $e^{j\delta_B}$ is determined for the faults nor being the phase-to-ground faults or phase-to-phase faults from the formula:

$$e^{j\delta_B} = \frac{(1+\underline{Z}_{1B}\underline{Y}_{1B})(\underline{Y}_{1B}\underline{V}_{B1}^{pre} - \underline{I}_{B1}^{pre}) + \underline{Y}_{1B}\underline{V}_{B1}^{pre}}{(1+\underline{Z}_{1A}\underline{Y}_{1A})(\underline{I}_{A1}^{pre} - \underline{Y}_{1A}\underline{V}_{A1}^{pre}) - \underline{Y}_{1A}\underline{V}_{A1}^{pre}}$$

where:
$\underline{V}_{A1}^{pre}$, $\underline{V}_{B1}^{pre}$—denote pre-fault positive sequence quantities (superscript 'pre' and subscript '1') of voltage measured at the ends A and B, respectively, $\underline{I}_{A1}^{pre}$, $\underline{I}_{B1}^{pre}$—denote pre-fault positive sequence quantities (superscript 'pre' and subscript '1') of current measured of the faulted line at the ends A and B, respectively, $\underline{Z}_{1A}$, $\underline{Y}_{1A}$—denote impedance and admittance of line section LA, $\underline{Z}_{1B}$, $\underline{Y}_{1B}$—denote impedance and admittance of line section LB.

LA—is the part of the line between line station A and series capacitor banks

LB—is the part of the between line station B and series capacitor banks.

The advantage of the method according to the invention is the overcoming of all the limitations and drawbacks of the known methods that means that parameters and status of the series capacitor bank are not required to be known since they are not utilized for determination of the distance to fault and fault resistance, i.e. only the position at which the compensating banks are installed has to be known. Additionally the reactance of series capacitors is measured using the pre-fault measurements. The synchronization angle is determined using the pre-fault measurements or alternatively, for single phase-to-ground faults and phase-to-phase faults which are the most common faults with using the post-fault measurements, and with strict considering the distributed parameter line model, what allows accurate analytical synchronization of the measurements acquired asynchronously. Then, the distances to fault are calculated by introducing the compensation for shunt capacitances of the line with use of the distributed parameter line model. Selection of the valid subroutine is done based on multi-criteria procedure, what allows for reliable valid results identification within very wide range of fault conditions, even for very high fault resistances.

BRIEF DESCRIPTION OF THE DRAWINGS

The method according to the present invention is explained in an embodiment shown in the drawing, where.

DETAILED DESCRIPTION OF ILLUSTRATIVE EMBODIMENTS

Figure 1:
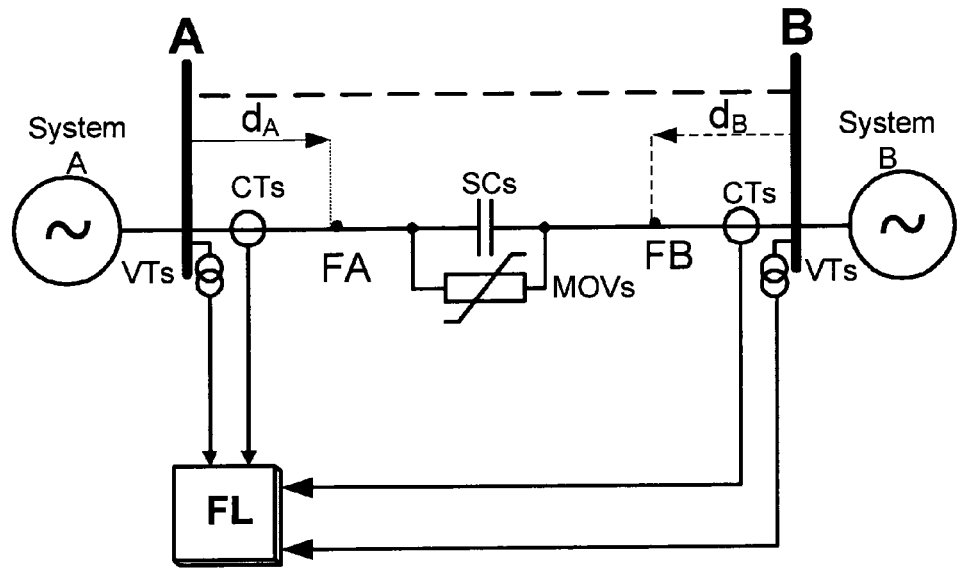
FIG. 1 presents a general diagram of the electric network for the implementation of the inventive method, FIG. 2—an equivalent circuit diagram of series-compensated line for pre-fault positive sequence considered for determining the synchronization angle, FIG. 3—for fault FA an equivalent circuit diagram of series-compensated line for positive sequence—the part containing the SC&MOV and the section between the SC&MOV and the station B, FIG. 4—for fault FA an equivalent circuit diagram of series-compensated line for positive sequence—the part containing the SC&MOV and the section between the SC&MOV and the station A, FIG. 5—for fault FA an equivalent circuit diagram of series-compensated line for negative sequence—the part containing the SC&MOV and the section between the SC&MOV and the station B, FIG. 6—for fault FA an equivalent circuit diagram of series-compensated line for negative sequence—the part containing the SC&MOV and the section between the SC&MOV and the station A, FIG. 7—for fault FB an equivalent circuit diagram of series-compensated line for positive sequence—the part containing the SC&MOV and the section between the SC&MOV and the station A, FIG. 8—for fault FB an equivalent circuit diagram of series-compensated line for positive sequence—the part containing the SC&MOV and the section between the SC&MOV and the station B, FIG. 9—for fault FB an equivalent circuit diagram of series-compensated line for negative sequence—the part containing the SC&MOV and the section between the SC&MOV and the station A, FIG. 10—for fault FB an equivalent circuit diagram of series-compensated line for negative sequence—the part containing the SC&MOV and the section between the SC&MOV and the station B, FIG. 11—an equivalent circuit diagram of series—compensated line for the pre-fault positive sequence, considering for measuring the compensating bank impedance, FIG. 12—a flow chart of the example of a fault location algorithm according to the present invention.

The transmission system shown in FIG. 1 consists of series compensated transmission line connecting two electric power stations A, and B. The installed series capacitor (SC-series capacitor) includes a metal oxide varistor (MOV—metal oxide varistor) connected in parallel (SC&MOV) which limits the voltage across the capacitor in a pre-defined manner. Station A is located at the beginning of the line, station B at the end of this line. In station A there is a fault locator FL. The fault locator can be also located at station B or at the separate place, what is not shown at the FIG. 1. Fault location is done using distributed parameters line model, models of faults and fault loops for symmetrical components positive, negative and zero, and different types of faults, by applying suitable share coefficients determining the relation between the symmetrical components of the total fault current when voltage drop across the fault resistance is estimated, defined as $a_{F1}$, $a_{F2}$, $a_{F0}$ and weight coefficients $a_1$, $a_2$, $a_0$, $a_{m0}$ defining the share of individual components in the total model of the fault loop.

Unsynchronised measurements of three-phase currents from stations A, B, and of three-phase voltages from station A and B are supplied to the fault locator FL. Fault locator is supplied with information about the type of the fault and the time of its occurrence. Then two hypothetical fault points are assumed and the distances $d_A$ and $d_B$ between the beginning of the given line section A and B and the fault points (FA, FB) are calculated in order to determinate valid results, i.e. consistent with the real fault case, on the following assumptions:

calculation of synchronization angle $\delta_A$, the distance $d_A$ from the beginning of the line in the station A to the fault point FA, fault resistance $R_{FA}$ and impedance of compensation bank at faults state $Z_{SC1\_ph}^{SUB-A}$, impedance of compensation bank at pre-fault state $Z_{SC1\_pre}$, assuming that the fault occurred in line section LA—steps 103a, 104a, 105a, 106a, where LA is the part of the line where the fault occurred between line station A and capacitor bank, calculation of synchronization angle $\delta_B$, the distance $d_B$ from the beginning of the line in the station B to the fault point FB, fault resistance $R_{FB}$ and impedance of compensation bank at faults stage $Z_{SC1\_ph}^{SUB-A}$, impedance of compensation bank at pre-fault state $Z_{SC1\_pre}$, assuming that the fault occurred in line section LB, where LB is the part of the line where the fault occurred between line station B and capacitor bank,—steps 103b, 104b, 105b, 106b.

Then among those two distances to fault $d_A$ and $d_B$ the valid results is selected—step 107.

Step 101. In stations A and B, current and voltage input signals from individual phases for fault conditions $I_{A\_a}$, $I_{A\_b}$, $I_{A\_c}$, $V_{A\_a}$, $V_{A\_b}$, $V_{A\_c}$, $I_{B\_a}$, $I_{B\_b}$, $I_{B\_c}$, $V_{B\_a}$, $V_{B\_b}$, $V_{B\_c}$ and for pre-fault conditions $I_{A\_pre\_a}$, $I_{A\_pre\_b}$, $I_{A\_pre\_c}$, $V_{A\_pre\_a}$, $V_{A\_pre\_b}$, $V_{A\_pre\_c}$, $I_{B\_pre\_a}$, $I_{B\_pre\_b}$, $I_{B\_pre\_c}$, $V_{B\_pre\_a}$, $V_{B\_pre\_b}$, $V_{B\_pre\_c}$ and in case of double-circuit line currents from the healthy parallel line $I_{Aparal\_a}$, $I_{Aparal\_b}$, $I_{Aparal\_c}$, $I_{Bparal\_a}$, $I_{Bparal\_b}$, $I_{Bparal\_c}$ or only zero sequence currents $I_{Aparal\_0}$, $I_{Bparal\_0}$ are measured.

Step 102. In this step, the symmetrical components of the phase currents measured in stations A and B, and of phase voltages measured in stations A and B for pre-fault conditions and fault conditions are calculated. The details of such calculation are well known to those skilled in the art.

Step 103a. In this step a synchronization angle $\delta_A$ is calculated as follows:

if there are phase-to-ground faults or phase-to-phase faults then from the analyzing the total fault current flow FIG. 3, FIG. 4, FIG. 5, FIG. 6, based on the assumption that faults occurs in the line section between station A and series capacitor and metal oxide varistor device SC&MOV the synchronization angle $\delta_A$ in term $e^{j\delta_A}$ from the formula is determined:

$$[e^{j\delta_A}]_{ph-g,ph-ph} = \frac{a_{F2}^{I-SET} \underline{I}_{SC2\_B} - a_{F1}^{II-SET} \underline{I}_{SC1\_B}}{a_{F1}^{II-SET} \underline{N}_{A1} - a_{F2}^{I-SET} \underline{N}_{A2}} \quad (1)$$

where:

subscript ph-g denotes phase to ground faults: a-g, b-g, c-g, and subscript ph-ph denotes phase to phase faults a-b, b-c, c-a.

$a_{F2}^{I-SET}$, $a_{F1}^{II-SET}$—denote the coefficients dependent of fault type gathered in Table 1, $$\underline{I}_{SC1\_B} = -\frac{1}{\underline{Z}_{c1L}}\sinh(\underline{\gamma}_{1L}(1-p_{SC})l)\cdot \underline{V}_{B1} + \cosh(\underline{\gamma}_{1L}(1-p_{SC})l)\cdot \underline{I}_{B1}, \quad (2)$$

$\underline{I}_{SC1\_B}$—denotes the positive sequence current from the station B after analytical transfer towards series capacitor banks SC&MOV, $$\underline{I}_{SC2\_B} = -\frac{1}{\underline{Z}_{c1L}}\sinh(\underline{\gamma}_{1L}(1-p_{SC})l)\cdot \underline{V}_{B2} + \cosh(\underline{\gamma}_{1L}(1-p_{SC})l)\cdot \underline{I}_{B2}, \quad (3)$$

$\underline{I}_{SC2\_B}$—denotes the negative sequence current from the station B after analytical transfer towards series capacitor banks SC&MOV, $$\underline{N}_{A1} = \cosh(\underline{\gamma}_{1L} p_{SC} l) \cdot \underline{I}_{A1} - \frac{1}{\underline{Z}_{c1L}} \sinh(\underline{\gamma}_{1L} p_{SC} l) \cdot \underline{V}_{A1}, \quad (4)$$

$$\underline{N}_{A2} = \cosh(\underline{\gamma}_{1L} p_{SC} l) \cdot \underline{I}_{A2} - \frac{1}{\underline{Z}_{c1L}} \sinh(\underline{\gamma}_{1L} p_{SC} l) \cdot \underline{V}_{A2}, \quad (5)$$

where:
l—denotes the total line length,
$p_{SC}$—denotes the distance (p.u.) per unit length, at which the compensation bank (SC&MOV) is installed far away from the station A, which is not presented on the drawings, $$\underline{Z}_{c1L} = \sqrt{\frac{\underline{Z}'_{1L}}{\underline{Y}'_{1L}}}$$

denotes the characteristic impedance of the line for the positive sequence,
$\underline{\gamma}_{1L} = \sqrt{\underline{Z}'_{1L} \underline{Y}'_{1L}}$—denotes the propagation constant of the line for the positive sequence,
$\underline{Z}'_{1L}, \underline{Y}'_{1L}$—denote the positive sequence impedance and admittance of the line per unit length.

It was considered for determining the negative-sequence quantities according to equations (3) and (5) that the positive- and negative-sequence line parameters are identical, as in reality. For both sequences the line parameters for the positive sequence (subscript: 1) are used. This is also applied in the following considerations.

Analysis of boundary conditions for different types of faults shows that there is a certain degree of freedom when determining the share coefficients determining the relation between the symmetrical components of the total fault current when voltage drop across the fault resistance is estimated. Their selection depends on the adopted preference of the use of individual sequence components depending on the type of the fault. In the presented example of the invention embodiment, in order to ensure high precision of the fault location, voltage drop across the fault resistance is estimated using positive and negative sequence components.

There are two characteristic alternative sets (among the other possible) of the share coefficients for the phase-to-ground a-g, b-g, c-g, and phase-to-phase faults a-b, b-c, c-a, as gathered in the table 1.

TABLE 1

Phase-to-ground faults and phase-to-phase faults - two alternative sets of share coefficients.

| FAULT | I-SET | | II-SET | |
|---|---|---|---|---|
| | $\underline{a}_{F1}^{I-SET}$ | $\underline{a}_{F2}^{I-SET}$ | $\underline{a}_{F1}^{II-SET}$ | $\underline{a}_{F2}^{II-SET}$ |
| a-g | 0 | 3 | 3 | 0 |
| b-g | 0 | $3\underline{a}$ | $3\underline{a}^2$ | 0 |
| c-g | 0 | $3\underline{a}^2$ | $3\underline{a}$ | 0 |
| a-b | 0 | $1 - \underline{a}$ | $1 - \underline{a}^2$ | 0 |
| b-c | 0 | $\underline{a} - \underline{a}^2$ | $\underline{a}^2 - \underline{a}$ | 0 |
| c-a | 0 | $\underline{a}^2 - 1$ | $\underline{a} - 1$ | 0 |

$\underline{a} = \exp(j2\pi/3)$

In contrast to the above fault types, the other situation is for the remaining fault types (phase-to-phase-to-ground and three phase symmetrical faults). This is so, since for these remaining faults there is no alternative sets of the share coefficients for the positive and the negative sequence—as gathered in the table 2.

TABLE 2

Set of share coefficients for phase-to-phase-to-ground faults and three phase faults.

| FAULT | $\underline{a}_{F1}$ | $\underline{a}_{F2}$ |
|---|---|---|
| a-b-g, a-b-c, a-b-c-g | $1 - \underline{a}^2$ | $1 - \underline{a}$ |
| b-c-g | $\underline{a}^2 - \underline{a}$ | $\underline{a} - \underline{a}^2$ |
| c-a-g | $\underline{a} - 1$ | $\underline{a}^2 - 1$ |

The type of the fault is denoted by symbols: a-g, b-g, c-g, a-b, b-c, c-a, a-b-g, a-b-c, a-b-c-g, b-c-g, c-a-g, where letters a, b, c denote individual phases, and letter g denotes earthing (ground), index 1 denotes the positive-sequence component, index 2—the negative component.

Figure 2:
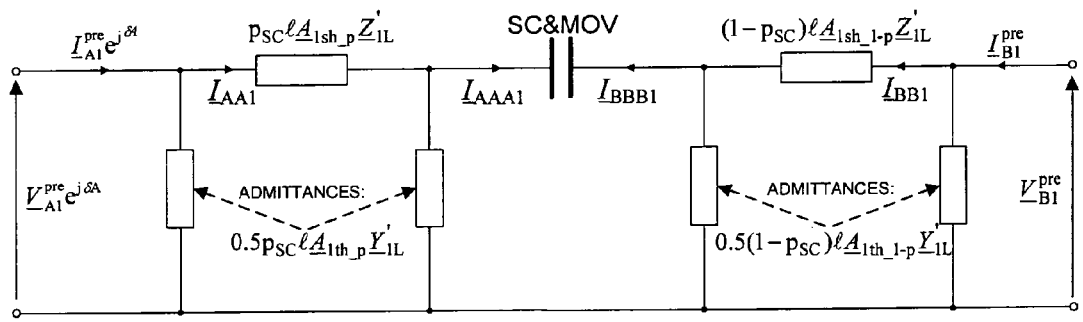
Figure 3:
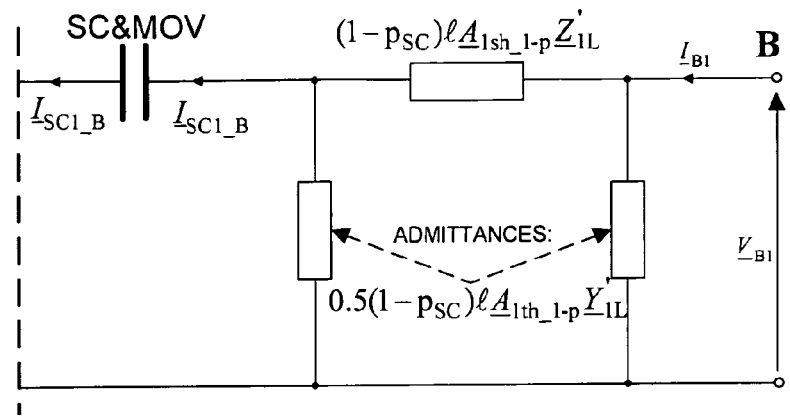
Figure 4:
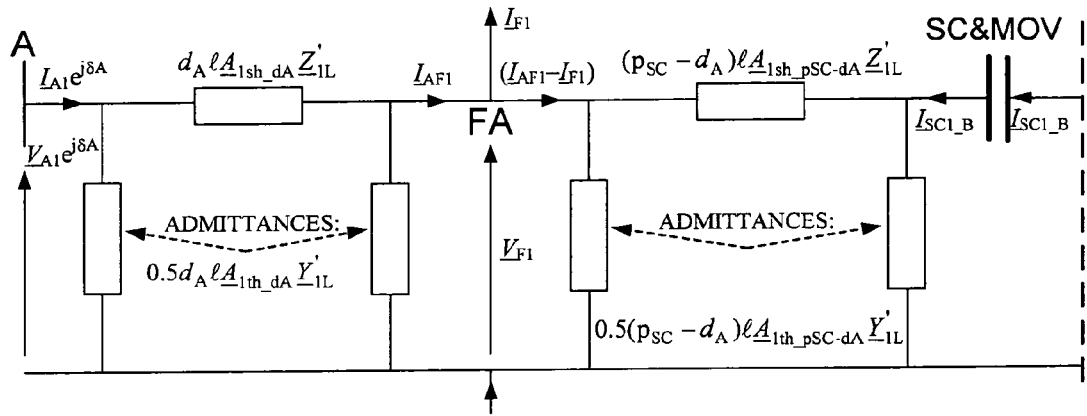
Figure 5:
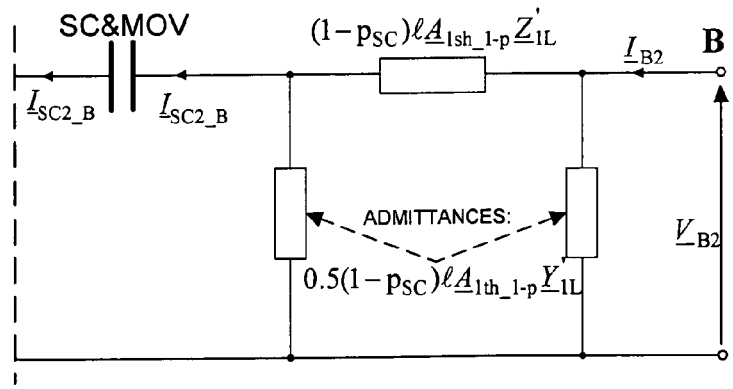
Figure 6:
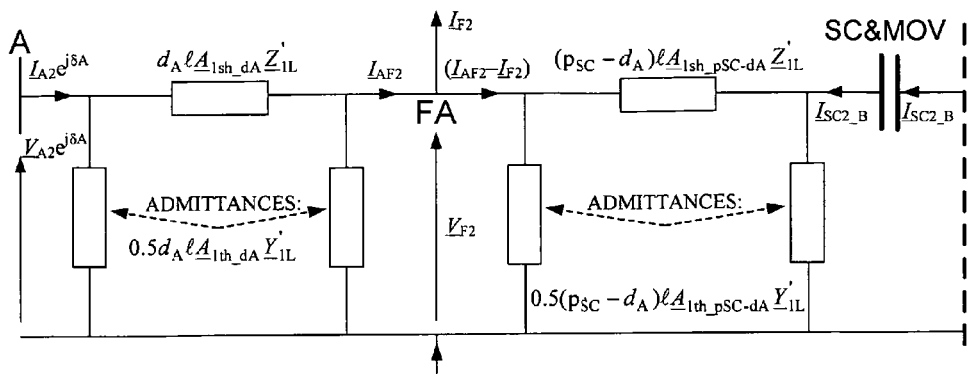
Figure 7:
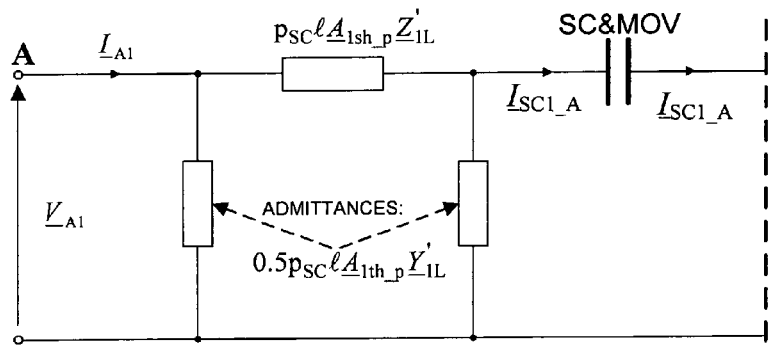
Figure 8:
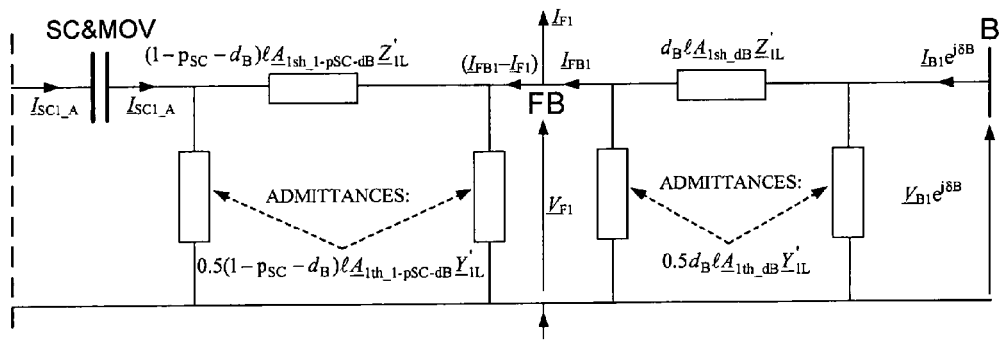
Figure 9:
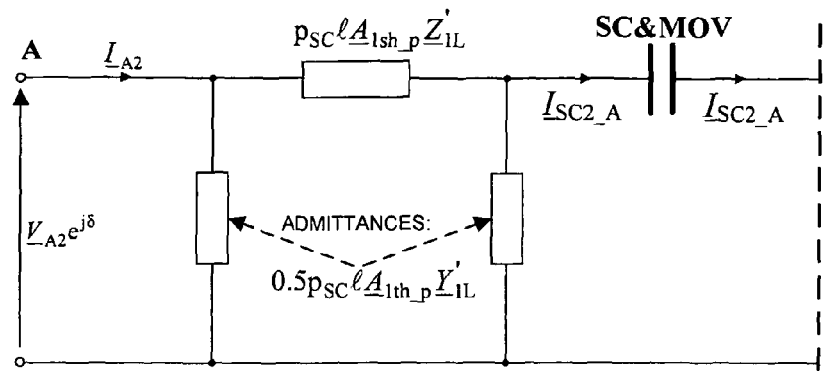
Figure 10:
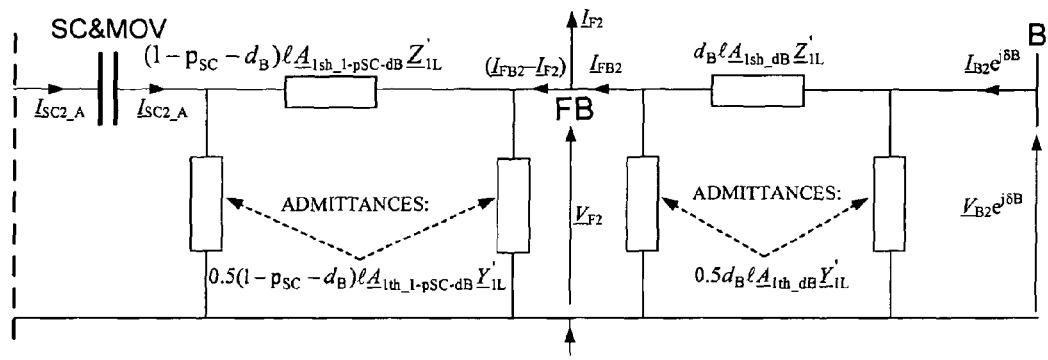
Figure 11:
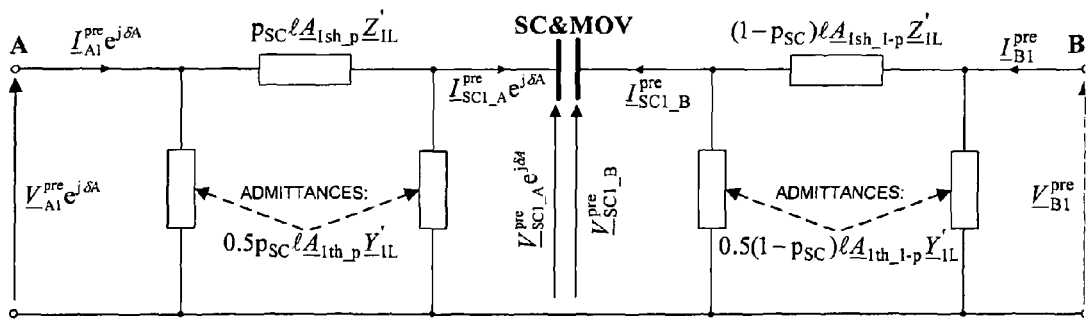
Figure 12:
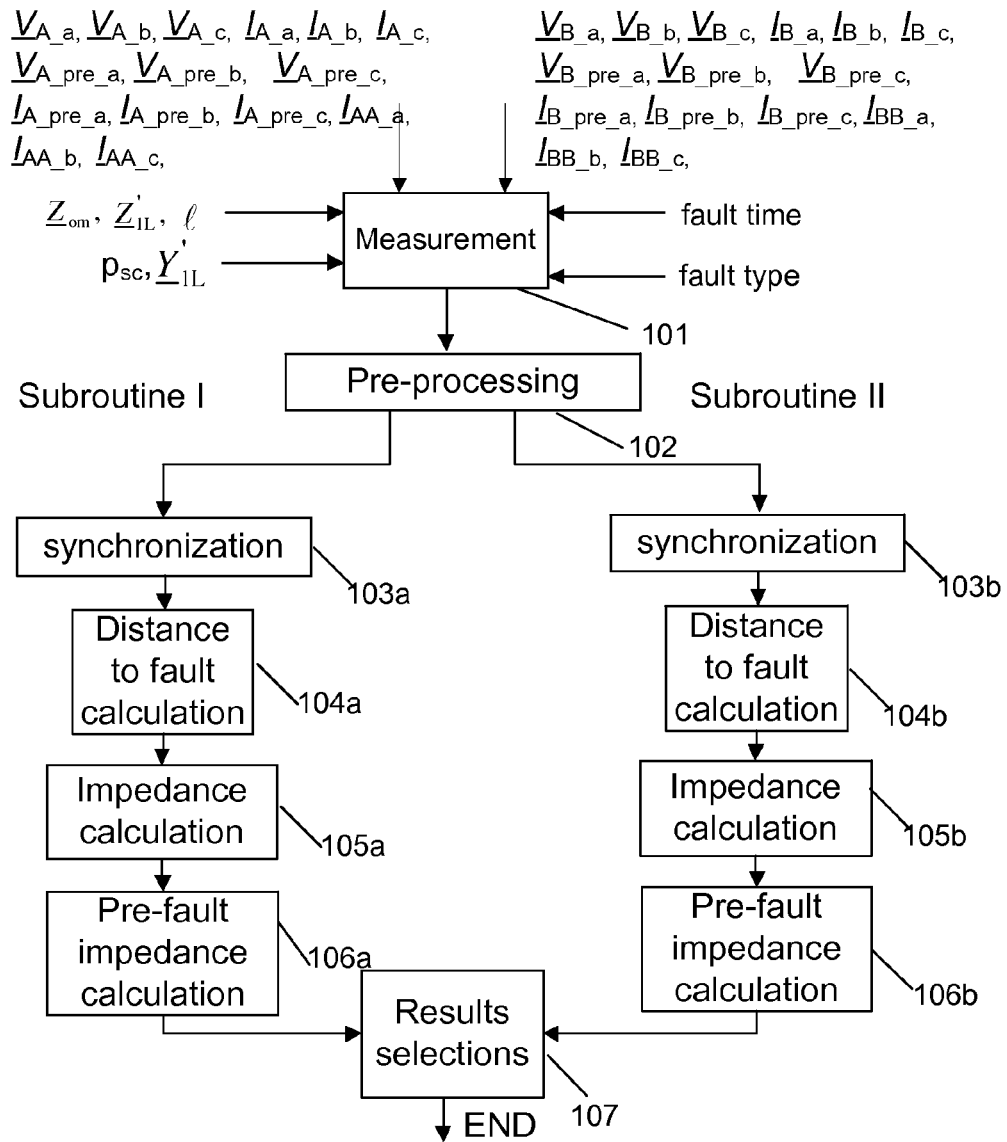

If there are not phase-to-ground faults and not phase-to-phase faults, then the synchronization angle $\delta_A$ in term $e^{j\delta_A}$ from the analysis of the current flow for the pre-fault conditions (FIG. 2) with using the distributed parameter line model is calculated from the formula:

$$e^{j\delta_A} = \frac{(1 + \underline{Z}_{1B}\underline{Y}_{1B})(\underline{Y}_{1B}\underline{V}_{B1}^{pre} - \underline{I}_{B1}^{pre}) + \underline{Y}_{1B}\underline{V}_{B1}^{pre}}{(1 + \underline{Z}_{1A}\underline{Y}_{1A})(\underline{I}_{A1}^{pre} - \underline{Y}_{1A}\underline{V}_{A1}^{pre}) - \underline{Y}_{1A}\underline{V}_{A1}^{pre}} \quad \text{where:} \quad (6)$$

$\underline{Z}_{1A} = p_{SC} l \underline{A}_{1sh\_p} \underline{Z}'_{1L},$ $\underline{Y}_{1A} = 0.5 p_{SC} l \underline{A}_{1th\_p} \underline{Y}'_{1L},$ $\underline{Z}_{1B} = (1 - p_{SC}) l \underline{A}_{1sh\_1-p} \underline{Z}'_{1L},$ $\underline{Y}_{1B} = 0.5(1 - p_{SC}) l \underline{A}_{1th\_1-p} \underline{Y}'_{1L},$ $\underline{A}_{1sh\_p} = \dfrac{\sinh(\underline{\gamma}_{1L} p_{SC} l)}{\underline{\gamma}_{1L} p_{SC} l},$ $\underline{A}_{1th\_p} = \dfrac{\tanh(0.5 \underline{\gamma}_{1L} p_{SC} l)}{0.5 \underline{\gamma}_{1L} p_{SC} l},$ $\underline{A}_{1sh\_1-p} = \dfrac{\sinh(\underline{\gamma}_{1L}(1 - p_{SC})l)}{\underline{\gamma}_{1L}(1 - p_{SC})l},$ $\underline{A}_{1th\_1-p} = \dfrac{\tanh(0.5 \underline{\gamma}_{1L}(1 - p_{SC})l)}{0.5 \underline{\gamma}_{1L}(1 - p_{SC})l},$ $\underline{V}_{A1}^{pre}, \underline{V}_{B1}^{pre}$—denote pre-fault positive sequence quantities (superscript 'pre' and subscript '1') of voltage measured at the ends A and B, respectively, $\underline{I}_{A1}^{pre}, \underline{I}_{B1}^{pre}$—denote pre-fault positive sequence quantities (superscript 'pre' and subscript '1') of current measured of the faulted line at the ends A and B, respectively.

Step 104a. Having determined the synchronization angle $\delta_A$, and in consequence the synchronization operator $e^{j\delta_A}$, one multiplies the phasors of the signals from the station A by this operator. This assures common reference for the phasors of signals acquired asynchronously at both line ends.

Taking into account the distributed parameter line model, the following generalised fault loop model is applied, covering different fault types, what is reflected with use of the appropriate weighting coefficients: $\underline{a}_i$ and share coefficients: $\underline{a}_{Fi}$, both dependent on a fault type, where i=0, 1, 2 and denote i-th symmetrical component, where the $\underline{a}_1, \underline{a}_2, \underline{a}_0, \underline{a}_{m0}$—weighting coefficients gathered in the table 3 and $\underline{a}_{F1}, \underline{a}_{F2}$—share coefficients gathered in the table 4.

$$\sum_{i=0}^{2} \underline{a}_i \big(\underline{V}_{Ai}\cosh(\underline{\gamma}_{iL}d_{LA}p_{SC}l) - \underline{Z}_{ciL}\underline{I}_{Ai}\sinh(\underline{\gamma}_{iL}d_{LA}p_{SC}l)\big)\cdot e^{j\delta A} - \tag{7}$$

$$R_{FA}\sum_{i=1}^{2} \frac{\underline{a}_{Fi}\underline{M}_i}{\cosh(\underline{\gamma}_{iL}(1-d_{LA})p_{SC}l)} = 0$$

for single line, $$\sum_{i=0}^{2} \underline{a}_i \big(\underline{V}_{Ai}\cosh(\underline{\gamma}_{iL}d_{LA}p_{SC}l) - \underline{Z}_{ciL}\underline{I}_{Ai}\sinh(\underline{\gamma}_{iL}d_{LA}p_{SC}l)\big)\cdot e^{j\delta A} - \tag{8}$$

$$R_{FA}\sum_{i=1}^{2} \frac{\underline{a}_{Fi}\underline{M}_i}{\cosh(\underline{\gamma}_{iL}(1-d_{LA})p_{SC}l)} -$$

$$\underline{a}_{m0}d_{LA}p_{SC}\underline{Z}_{0m}\underline{I}_{Aparal\_0}\cdot e^{j\delta A} = 0$$

for double-circuit line
where:

$d_{LA}$—denotes the unknown hypothetical distance to fault in [p.u.], expressed in relation to the length ($p_{SC}l$) of the line section between the station A and the series capacitor bank, $R_{FA}$—denotes the unknown fault resistance, $$\underline{M}_1 = \cosh(\underline{\gamma}_{1L}p_{SC}l)\underline{I}_{A1}e^{j\delta A} - \frac{\sinh(\underline{\gamma}_{1L}p_{SC}l)\underline{V}_{A1}e^{j\delta A}}{\underline{Z}_{c1L}} -$$

$$\frac{\sinh(\underline{\gamma}_{1L}(1-p_{SC})l)\cdot\underline{V}_{B1}}{\underline{Z}_{c1L}} + \cosh(\underline{\gamma}_{1L}(1-p_{SC})l)\cdot\underline{I}_{B1},$$

$$\underline{M}_2 = \cosh(\underline{\gamma}_{1L}p_{SC}l)\underline{I}_{A2}e^{j\delta A} - \frac{\sinh(\underline{\gamma}_{1L}p_{SC}l)\underline{V}_{A2}e^{j\delta A}}{\underline{Z}_{c1L}} -$$

$$\frac{\sinh(\underline{\gamma}_{1L}(1-p_{SC})l)\cdot\underline{V}_{B2}}{\underline{Z}_{c1L}} + \cosh(\underline{\gamma}_{1L}(1-p_{SC})l)\cdot\underline{I}_{B2},$$

$\underline{a}_1, \underline{a}_2, \underline{a}_0, \underline{a}_{m0}$—denote the weighting coefficients dependent on fault type gathered in the table 3, $\underline{a}_{F1}, \underline{a}_{F2}$—denote the share coefficients dependent on fault type gathered in the table 4, $\underline{Z}_{0m}$—mutual coupling impedance for zero sequence, $\underline{I}_{Aparal\_0}$—denotes zero sequence current from the station A measured in healthy parallel line

TABLE 3

Weighting Coefficients for Composing Fault loop Voltage And Current

| FAULT | $\underline{a}_1$ | $\underline{a}_2$ | $\underline{a}_0$ | $\underline{a}_{m0}$ |
|---|---|---|---|---|
| a-g | 1 | 1 | 1 | 1 |
| b-g | $-0.5 - j0.5\sqrt{3}$ | $0.5 + j0.5\sqrt{3}$ | 1 | 1 |
| c-g | $0.5 + j0.5\sqrt{3}$ | $-0.5 - j0.5\sqrt{3}$ | 1 | 1 |
| a-b, a-b-g | $1.5 + j0.5\sqrt{3}$ | $1.5 - j0.5\sqrt{3}$ | 0 | 0 |
| a-b-c, a-b-c-g | | | | |
| b-c, b-c-g | $-j\sqrt{3}$ | $j\sqrt{3}$ | 0 | 0 |
| c-a, c-a-g | $-1.5 + j0.5\sqrt{3}$ | $-1.5 - j0.5\sqrt{3}$ | 0 | 0 |

$\underline{a}_{0m}$ - used in case of double circuit lines for mutual coupling compensation

TABLE 4

Share Coefficients Used For calculation Of Total Fault Current

| FAULT | $\underline{a}_{F1}$ | $\underline{a}_{F2}$ | $\underline{a}_{F0}$ |
|---|---|---|---|
| a-g | 0 | 3 | 0 |
| b-g | 0 | $1.5 + j1.5\sqrt{3}$ | 0 |
| c-g | 0 | $-1.5 - j1.5\sqrt{3}$ | 0 |
| a-b | 0 | $1.5 - j0.5\sqrt{3}$ | 0 |
| b-c | 0 | $j\sqrt{3}$ | 0 |
| c-a | 0 | $-1.5 - j0.5\sqrt{3}$ | 0 |
| a-b-g | $1.5 + j0.5\sqrt{3}$ | $1.5 - j0.5\sqrt{3}$ | 0 |
| b-c-g | $-j\sqrt{3}$ | $j\sqrt{3}$ | 0 |
| c-a-g | $-1.5 + j0.5\sqrt{3}$ | $-1.5 - j0.5\sqrt{3}$ | 0 |
| a-b-c | $1.5 + j0.5\sqrt{3}$ | $1.5 - j0.5\sqrt{3}$*) | 0 |
| a-b-c-g | | | |

$j = \sqrt{-1}$,
*)$\underline{a}_{F2} \neq 0$, however the negative sequence components are not present in the signals Resolving equation (7) or (8) into the real/imaginary parts allows to solve it for the unknowns: $d_{LA}$ and $R_{FA}$. As for example, the iterative Newton-Raphson method can be applied for that. This method requires setting the starting values for the sought values. These values can be set to: 0.5 [p.u.] for $d_{LA}$, and 0 for $R_{FA}$.

After completing the solution of (7) or (8), the distance to fault $d_A$ [p.u.], which is related to the whole line length l, between the stations A and B, is calculated as:

$$d_A = p_{sc}d_{LA} \tag{9}$$

where $d_{LA}$ is the result from the last iterative solution of the equation (7) or (8).

Step 105a. In this step the equivalent impedance of compensating bank at fault stage is calculated with using the post fault values of measured voltage and currents.

$$\underline{Z}_{SC1\_ph}^{SUB\_A} = \frac{\Delta \underline{V}_{SC\_ph}^{SUB\_A}}{\underline{I}_{SC\_ph}^{SUB\_A}} \text{ where:} \tag{10}$$

$$\Delta \underline{V}_{SC\_ph}^{SUB\_A} = \underline{a}_{1\_}\Delta \underline{V}_{SC\_1}^{SUB\_A} + \underline{a}_{2\_}\Delta \underline{V}_{SC\_2}^{SUB\_A} + \underline{a}_{0\_}\Delta \underline{V}_{SC\_0}^{SUB\_A},$$

$$\underline{I}_{SC\_ph}^{SUB\_A} = \underline{a}_{1\_}\Delta \underline{I}_{SC\_1}^{SUB\_A} + \underline{a}_{2\_}\Delta \underline{I}_{SC\_2}^{SUB\_A} + \underline{a}_{0\_}\underline{I}_{SC\_0}^{SUB\_A},$$

$\Delta \underline{V}_{SC\_ph}^{SUB\_A}$, $\underline{I}_{SC\_ph}^{SUB\_A}$—denote the phase quantities of voltage and currents calculated from i-th symmetrical components of voltage drop and i-th symmetrical component of current entering SC&MOV bank, with neglecting the shunt capacitances of the line:

in case of single phase to ground fault: the faulted phase
in case of inter-phase fault: any of the faulted phases, $\Delta \underline{V}_{SC\_i}^{SUB\_A} = \underline{V}_{Bi} - \underline{V}_{Ai}e^{j\delta A} - \underline{Z}_{iL}\underline{I}_{Ai}e^{j\delta A} + d_A(\underline{Z}_{iL}\underline{I}_{Ai}e^{j\delta A} + \underline{Z}_{iL}\underline{I}_{Bi})$—denotes the i-th symmetrical component of voltage drop across the SCs&MOVs, $\underline{I}_{SC\_i}^{SUB\_A} = \underline{I}_{Bi}$—denotes i-th symmetrical component of current entering SC&MOV bank, with neglecting the shunt capacitances of the line, $\underline{a}_{1\_}, \underline{a}_{2\_}, \underline{a}_{0\_}$—complex coefficients dependent on fault type which are selected in such a way that in case of:

single phase to ground fault—the faulted phase, as for example for a-g fault the equivalent impedance of SC&MOV in phase 'a' is determined,
inter-phase fault—any of the faulted phases, as for example for a-b fault the equivalent impedance of SC&MOV in phase 'a' is determined.

Step 106a. At this stage the equivalent impedance of compensation bank at pre-fault stage is calculated:

$$Z_{SC1\_pre} = \frac{\Delta V_{SC1}^{pre}}{I_{SC1\_B}^{pre}} \quad \text{where:} \tag{11}$$

$$\Delta V_{SC1}^{pre} = V_{SC1\_B}^{pre} - V_{SC1\_A}^{pre} e^{j\delta_A},$$

$$V_{SC1\_A}^{pre} = \cosh(\underline{\gamma}_{1L} p_{SC} l) \cdot V_{A1}^{pre} - Z_{c1L} \sinh(\underline{\gamma}_{1L} p_{SC} l) \cdot I_{A1}^{pre},$$

$$V_{SC1\_B}^{pre} = \cosh(\underline{\gamma}_{1L}(1-p_{SC})l) \cdot V_{A1}^{pre} - Z_{c1L} \sinh(\underline{\gamma}_{1L}(1-p_{SC})l) \cdot I_{B1}^{pre},$$

$$I_{SC1\_B}^{pre} = -\frac{1}{Z_{c1L}} \sinh(\underline{\gamma}_{1L}(1-p_{SC})l) \cdot V_{B1}^{pre} + \cosh(\underline{\gamma}_{1L}(1-p_{SC})l) \cdot I_{B1}^{pre}.$$

Step 103b. In this step the synchronization angle is calculated as follows:
if there is phase-to-ground faults or phase-to-phase faults then from the analyzing the total fault current flow (FIG. 7, FIG. 8, FIG. 9, FIG. 10), based on the assumption that faults occurs in the line section between station B and series capacitor and metal oxide varistor device SC&MOV determining the synchronization angle $\delta_B$ in term $e^{j\delta_B}$ from the formula:

$$[e^{j\delta_B}]_{ph-g,ph-ph} = \frac{a_{F2}^{I-SET} I_{SC2\_A} - a_{F1}^{II-SET} I_{SC1\_A}}{a_{F1}^{II-SET} \underline{N}_{B1} - a_{F2}^{I-SET} \underline{N}_{B2}} \tag{12}$$

where:
$a_{F2}^{I-SET}$, $a_{F1}^{II-SET}$—denote the coefficients dependent of fault type gathered in table 1, F2

$$I_{SC1\_A} = -\frac{1}{Z_{c1L}} \sinh(\underline{\gamma}_{1L} p_{SC} l) \cdot \underline{V}_{A1} + \cosh(\underline{\gamma}_{1L} p_{SC} l) \cdot I_{A1}, \tag{13}$$

$I_{SC1\_A}$—denotes positive sequence current from the station A after analytical transfer towards series capacitor banks SC&MOV, $$I_{SC2\_A} = -\frac{1}{Z_{c1L}} \sinh(\underline{\gamma}_{1L} p_{SC} l) \cdot \underline{V}_{A2} + \cosh(\underline{\gamma}_{1L} p_{SC} l) \cdot I_{A2}, \tag{14}$$

$I_{SC2\_A}$—denotes negative sequence current from the station A after analytical transfer towards series capacitor banks SC&MOV, $$\underline{N}_{B1} = \cosh(\underline{\gamma}_{1L}(1-p_{SC})l) \cdot I_{B1} - \frac{1}{Z_{c1L}} \sinh(\underline{\gamma}_{1L}(1-p_{SC})l) \cdot \underline{V}_{B1}, \tag{15}$$

$$\underline{N}_{B2} = \cosh(\underline{\gamma}_{1L}(1-p_{SC})l) \cdot I_{B2} - \frac{1}{Z_{c1L}} \sinh(\underline{\gamma}_{1L}(1-p_{SC})l) \cdot \underline{V}_{B2}, \tag{16}$$

where:
l—denotes total line length,
$p_{SC}$—denotes distance (p.u.) at which the compensation bank (SCs&MOVs) is installed far away from the station A, $$Z_{c1L} = \sqrt{\frac{Z'_{1L}}{Y'_{1L}}}$$

denotes characteristic impedance of the line for the positive sequence,
$\underline{\gamma}_{1L} = \sqrt{\underline{Z}'_{1L} \underline{Y}'_{1L}}$—denotes propagation constant of the line for the positive sequence, $\underline{Z}'_{1L}, \underline{Y}'_{1L}$—denote positive sequence impedance and admittance of the line per unit length.

It was considered for determining the negative-sequence quantities according to equations (14) and (16) that the positive- and negative-sequence line parameters are identical, as in reality. For both sequences the line parameters for the positive sequence (subscript: 1) are used. This is also applied in the following considerations:
if there are not phase-to-ground faults and not phase-to-phase faults then determining the synchronization angle $\delta_B$ for phase-to-ground faults and phase-to-phase faults in term $e^{j\delta_B}$ from the formula (6).

Step 104b. Having determined the synchronization angle $\delta_B$, and in consequence the synchronization operator $e^{j\delta_B}$, one multiplies the phasors of the signals from the end B by this operator. This assures common reference for the phasors of signals acquired asynchronously at both line ends.

Taking into account the distributed parameter line model, the following generalised fault loop model, covering different fault types, what is reflected with use of the appropriate weighting coefficients: $a_i$ and share coefficients: $a_{Fi}$, both dependent on a fault type is applied, where the $\underline{a}_1$, $\underline{a}_2$, $\underline{a}_0$, $\underline{a}_{m0}$—weighting coefficients gathered in the table $\overline{3}$ and $\underline{a}_{F1}$, $\underline{a}_{F2}$—share coefficients gathered in the table 4.

$$\sum_{i=0}^{2} \underline{a}_i (\underline{V}_{Bi} \cosh(\underline{\gamma}_{iL} d_{LB}(1-p_{SC})l) - \underline{Z}_{ciL} I_{Bi} \sinh(\underline{\gamma}_{iL} d_{LB}(1-p_{SC})l)) \cdot \tag{17}$$

$$e^{j\delta_B} - R_{FB} \sum_{i=1}^{2} \frac{\underline{a}_{Fi} \underline{M}_i}{\cosh(\underline{\gamma}_{iL}(1-d_{LB})(1-p_{SC})l)} = 0$$

for single line, $$\sum_{i=0}^{2} \underline{a}_i (\underline{V}_{Bi} \cosh(\underline{\gamma}_{iL} d_{LB}(1-p_{SC})l) - \underline{Z}_{ciL} I_{Bi} \sinh(\underline{\gamma}_{iL} d_{LB}(1-p_{SC})l)) \cdot \tag{18}$$

$$e^{j\delta_B} - R_{FB} \sum_{i=1}^{2} \frac{\underline{a}_{Fi} \underline{M}_i}{\cosh(\underline{\gamma}_{iL}(1-d_{LB})(1-p_{SC})l)} -$$

$$\underline{a}_{m0} d_{LB}(1-p_{SC}) Z_{0m} I_{Bparal\_0} \cdot e^{j\delta_B} = 0$$

for double-circuit line
where:
$d_{LB}$—denotes the unknown hiphotetical distance to fault in [p.u.], expressed in relation to the length $((1-P_{SC})l)$ of the line section between the station B and the series capacitor bank,
$R_{FB}$—denotes the unknown fault resistance, $$\underline{M}_1 = \cosh(\underline{\gamma}_{1L}(1-p_{SC})l) I_{B1} e^{j\delta_B} - \frac{\sinh(\underline{\gamma}_{1L}(1-p_{SC})l) \underline{V}_{B1} e^{j\delta_B}}{Z_{c1L}} -$$

$$\frac{\sinh(\underline{\gamma}_{1L} p_{SC} l) \cdot \underline{V}_{A1}}{Z_{c1L}} + \cosh(\underline{\gamma}_{1L} p_{SC} l) \cdot I_{A1},$$

$$\underline{M}_2 = \cosh(\underline{\gamma}_{1L}(1-p_{SC})l) I_{B2} e^{j\delta_B} - \frac{\sinh(\underline{\gamma}_{1L}(1-p_{SC})l) \underline{V}_{B2} e^{j\delta_B}}{Z_{c1L}} -$$

$$\frac{\sinh(\underline{\gamma}_{1L} p_{SC} l) \cdot \underline{V}_{A2}}{Z_{c1L}} + \cosh(\underline{\gamma}_{1L} p_{SC} l) \cdot I_{A2},$$

$a_1$, $a_2$, $a_0$, $a_{m0}$—denote weighting coefficients dependent on fault type gathered in table 3, $a_{F1}$, $a_{F2}$—denote share coefficients dependent on fault type, gathered in table 4, $Z_{0m}$—mutual coupling impedance for zero sequence, $I_{Bparal\_0}$—denotes zero sequence current from the station B measured in parallel line Resolving equation (17) or (18) into the real/imaginary parts allows to solve it for the unknowns: $d_{LB}$, $R_{FB}$. As for example, the iterative Newton-Raphson method can be applied for that. This method requires setting the starting values for the sought values. These values can be set to: 0.5 [p.u.] for $d_{LB}$ and 0 for $R_{FB}$.

After completing the solution of (17) or (18), the distance to fault $d_B$ [p.u.], which is related to the whole line length l, between the stations A and B, is calculated as:

$$d_B = (1 - p_{SC}) d_{LB} \quad (19)$$

where $d_{LB}$ is the result from the last iterative solution of (17) or (18).

Step 105B. The equivalent impedance of compensating bank at fault stage is calculated with using the post fault values of measured voltage and currents:

$$Z_{SC1\_ph}^{SUB\_B} = \frac{\Delta V_{SC\_ph}^{SUB\_B}}{I_{SC\_ph}^{SUB\_B}} \quad (20)$$

where:

$$\Delta V_{SC\_ph}^{SUB\_B} = \underline{a}_1 \Delta V_{SC\_1}^{SUB\_B} + \underline{a}_2 \Delta V_{SC\_2}^{SUB\_B} + \underline{a}_0 \Delta V_{SC\_0}^{SUB\_B},$$

$$I_{SC\_ph}^{SUB\_B} = \underline{a}_1 \Delta I_{SC\_1}^{SUB\_B} + \underline{a}_2 \Delta I_{SC\_2}^{SUB\_B} + \underline{a}_0 I_{SC\_0}^{SUB\_B},$$

$\Delta V_{SC\_ph}^{SUB\_A}$, $I_{SC\_ph}^{SUB\_A}$—denote phase quantities of voltage and currents calculated from i-th symmetrical components of voltage drop and i-th symmetrical component of current entering SC&MOV bank, with neglecting the shunt capacitances of the line in case of single phase to ground fault: the faulted phase,
in case of inter-phase fault: any of the faulted phases, $\underline{a}_{1\_}$, $\underline{a}_{2\_}$, $\underline{a}_{0\_}$—denote complex coefficients dependent on fault type, which are selected in such a way that in case of:

single phase to ground fault: the faulted phase, as for example for a-g fault the equivalent impedance of SC&MOV in phase 'a' is determined,
inter-phase fault: any of the faulted phases, as for example for a-b fault the equivalent impedance of SC&MOV in phase 'a' is determined, $\Delta V_{SC}^{SUB\_B} = V_{Ai} - V_{Bi} e^{j\delta_B} - Z_{iL} I_{Bi} + d_B (Z_{iL} I_{Ai} e^{j\delta_A} + Z_{iL} I_{Bi} e^{j\delta_B})$—denotes the voltage drop across the SCs&MOVs for the i-th symmetrical component, $I_{SC\_i}^{SUB\_B} = I_{Ai}$—denote the i-th symmetrical component of current entering SC&MOV bank, with neglecting the shunt capacitances of the line.

Step 106b. At this stage the equivalent impedance of compensation bank at pre-fault stage is calculated as in step 106a Step 107. At this step the selection of final results is generated. First, it is check whether the particular subroutine I and subroutine II yields the distance to fault within the section range and whether the fault resistance is of positive value. If this is not, so (if the determined distance to fault lays outside the section range and/or the fault resistance is negative) then such subroutine is rejected.

Next, the features "real" and:"imag" of the estimated equivalent circuit of compensation banks SCs&MOVS are checked. If it is satisfied the following dependence:

real($Z_{SC1\_ph}^{SUB\_A}$)>0, imag($Z_{SC1\_ph}^{SUB\_A}$)<0 and imag($Z_{SC1\_ph}^{SUB\_A}$)>imag($Z_{SC1\_pre}$)

that denotes, that the fault has occurred between the station A and the SC&MOV bank, and the results:

$d_A$—distance to fault (p.u.), counted from the station A up to fault point F (FIG. 1), $R_{FA}$—fault resistance, are the valid results, i.e. consistent with the real fault case.

If opposite dependences are satisfying, that means:

real($Z_{SC1\_ph}^{SUB\_B}$)>0, imag($Z_{SC1\_ph}^{SUB\_B}$)<0 and imag($Z_{SC1\_ph}^{SUB\_B}$)>imag($Z_{SC1\_pre}$)

that denotes that the fault has occurred between the station B and the SC&MOV bank, and the results:

$d_B$—distance to fault (p.u.), counted from the station B up to fault point F (FIG. 1), $R_{FB}$—fault resistance, are the valid results, i.e. consistent with the real fault case.

It is observed that selection of $d_A$ or $d_B$ is independent of the status and/or value of series capacitance.

The invention claimed is:

1. A computer program product comprising non-transitory computer-readable program code which when executed on a computing device carries out the steps of detecting a location of a fault in one or more power transmission lines that extend between a station A and a station B and have a series capacitor and metal oxide varistor device (SC&MOV) connected therein, using unsynchronized voltage and current measurements in the stations A and B, before and after occurrence of the fault, performing a subroutine I for determining if the fault occurred in a line section (LA) between the station A and the SC&MOV and determining a distance ($d_A$) to the fault from station A, performing a subroutine II for determining if the fault occurred in a line section (LB) between the station B and the SC&MOV and determining a distance ($d_B$) to the fault from station B wherein subroutine I comprises the following steps:

(A1.) determining a synchronization angle ($\delta A$) in term ($e^{j\delta_A}$) for a known type of fault which is phase-to-ground faults or phase-to-phase faults, from the formula:

$$[e^{j\delta_A}]_{ph-g, ph-ph} = \frac{\underline{a}_{F2}^{I-SET} I_{SC2\_B} - \underline{a}_{F1}^{II-SET} I_{SC1\_B}}{\underline{a}_{F1}^{II-SET} \underline{N}_{A1} - \underline{a}_{F2}^{I-SET} \underline{N}_{A2}}$$

where:

subscript ph-g denotes phase to ground faults: a-g, b-g, c-g, and subscript ph-ph denotes phase to phase faults a-b, b-c, c-a, $\underline{a}_{F2}^{I-SET}$, $\underline{a}_{F1}^{II-SET}$—denote coefficients dependent on fault type, $I_{SC1\_B}$—denotes the positive sequence current from the station B after analytical transfer towards the SC&MOV, $I_{SC2\_B}$—denotes the negative sequence current from the station B after analytical transfer towards the SC&MOV, $\underline{N}_{A1}$, $\underline{N}_{A2}$—denote coefficients dependent on positive and negative sequence currents and voltage taken at station A respectively as well as parameters of the one or more power transmission lines, or for faults not being the phase-to-ground faults or phase-to-phase faults from the formula:

$$e^{j\delta_A} = \frac{(1+\underline{Z}_{1B}\underline{Y}_{1B})(\underline{V}_{B1}^{pre}-\underline{I}_{B1}^{pre})+\underline{Y}_{1B}\underline{V}_{B1}^{pre}}{(1+\underline{Z}_{1A}\underline{Y}_{1A})(\underline{I}_{A1}^{pre}-\underline{Y}_{1A}\underline{V}_{A1}^{pre})-\underline{Y}_{1A}\underline{V}_{A1}^{pre}}$$

where:

$\underline{V}_{A1}^{pre}$, $\underline{V}_{B1}^{pre}$—denote pre-fault positive sequence quantities of voltage measured at the ends A and B, respectively, $\underline{I}_{A1}^{pre}$, $\underline{I}_{B1}^{pre}$—denote pre-fault positive sequence quantities of current measured of the faulted one or more power transmission lines at the ends A and B, respectively, $\underline{Z}_{1A}$, $\underline{Y}_{1A}$—denote impedance and admittance, respectively, of line section LA, $\underline{Z}_{1B}$, $\underline{Y}_{1B}$—denote impedance and admittance, respectively, of line section LB, (A2.) then taking into account a distributed parameter line model and solving the formula:

$$d_A = p_{SC} d_{LA},$$

where:

$p_{sc}$—denotes a distance (p.u.) per unit of total line length l at which the SC&MOV is installed in the transmission line from the station A, and $d_{LA}$—denotes a hypothetical distance to fault, expressed in relation to length $p_{SC}l$ and which value is received using known iterative method by solving the fault loop formula:

$$\sum_{i=0}^{2} \underline{a}_i(\underline{V}_{Ai}\cosh(\underline{\gamma}_{iL}d_{LA}p_{SC}l)-\underline{Z}_{ciL}\underline{I}_{Ai}\sinh(\underline{\gamma}_{iL}d_{LA}p_{SC}l))\cdot e^{j\delta_A} -$$

$$R_{FA}\sum_{i=1}^{2}\frac{\underline{a}_{Fi}\underline{M}_i}{\cosh(\underline{\gamma}_{iL}(1-d_{LA})p_{SC}l)} = 0$$

for single line,
in which:

$P_{SC}l$—denotes a length (km) from station A at which SC&MOV is installed in the transmission line, $\underline{V}_{Ai}$—zero, positive, and negative voltage sequences measured at the end A, and wherein i=0, 1, 2, denoting the i-th symmetrical component, $\underline{Z}_{ciL}$—zero, positive, and negative sequence line impedances, and wherein i=0, 1, 2, denoting the i-th symmetrical component, $\underline{I}_{Ai}$—zero, positive, and negative sequence currents measured at the end A, and wherein i=0, 1, 2, denoting the i-th symmetrical component, $\underline{\gamma}_{iL}$—zero, positive, and negative sequences of line admittance, and wherein i=0, 1, 2, denoting the i-th symmetrical component;

$$\sum_{i=0}^{2} \underline{a}_i(\underline{V}_{Ai}\cosh(\underline{\gamma}_{iL}d_{LA}p_{SC}l)-\underline{Z}_{ciL}\underline{I}_{Ai}\sinh(\underline{\gamma}_{iL}d_{LA}p_{SC}l))\cdot e^{j\delta_A} -$$

$$R_{FA}\sum_{i=1}^{2}\frac{\underline{a}_{Fi}\underline{M}_i}{\cosh(\underline{\gamma}_{iL}(1-d_{LA}p_{SC}l))} - \underline{a}_{m0}d_{LA}p_{SC}\underline{Z}_{0m}\underline{I}_{Aparal\_0}\cdot e^{j\delta_A} = 0$$

for double-circuit line,
in which:

$R_{FA}$—denotes an unknown fault resistance, which a value is received using known iterative method by solving the fault loop formula above, $\underline{a}_1$, $\underline{a}_2$, $\underline{a}_0$, $\underline{a}_{m0}$—denotes weighting coefficients dependent on fault type, $\underline{M}_i$—denote numerical components for positive and negative sequences, $\underline{a}_{F0}$, $\underline{a}_{F1}$, $\underline{a}_{F2}$—denotes the share coefficients dependent on fault type, $\underline{Z}_{0m}$—mutual coupling impedance for zero sequence, $\underline{I}_{Aparal\_0}$—denotes zero sequence current from the station A measured in a healthy parallel line, $\underline{V}_{Ai}$—zero, positive, and negative voltage sequences measured at the end A, and wherein i=0, 1, 2, denoting the i-th symmetrical component, $\underline{Z}_{ciL}$—zero, positive, and negative sequence line impedances, and wherein i=0, 1, 2, denoting the i-th symmetrical component, $\underline{I}_{Ai}$—zero, positive, and negative sequence currents measured at the end A, and wherein i=0, 1, 2, denoting the i-th symmetrical component, $\underline{\gamma}_{iL}$—zero, positive, and negative sequences of line admittance, and wherein i=0, 1, 2, denoting the i-th symmetrical component, (A3.) then an equivalent impedance of the SC&MOV at fault stage ($\underline{Z}_{SC1\_ph}^{SUB\_A}$) is calculated from the equation:

$$\underline{Z}_{SC1\_ph}^{SUB\_A} = \frac{\Delta \underline{V}_{SC\_ph}^{SUB\_A}}{\underline{I}_{SC\_ph}^{SUB\_A}}$$

where:

$\Delta \underline{V}_{SC\_ph}^{SUB\_A} = \underline{a}_1 \Delta \underline{V}_{SC\_1}^{SUB\_A} + \underline{a}_2 \Delta \underline{V}_{SC\_2}^{SUB\_A} + \underline{a}_0 \Delta \underline{V}_{SC\_0}^{SUB\_A}$, $\underline{I}_{SC\_ph}^{SUB\_A} = \underline{a}_1 \Delta \underline{I}_{SC\_1}^{SUB\_A} + \underline{a}_2 \Delta \underline{I}_{SC\_2}^{SUB\_A} + \underline{a}_0 \underline{I}_{SC\_0}^{SUB\_A}$, $\Delta \underline{V}_{SC\_ph}^{SUB\_A}$ and $\underline{I}_{SC\_ph}^{SUB\_A}$ denote the phase quantities of voltage and currents calculated from the i-th symmetrical components of voltage drop and i-th symmetrical component of current entering the SC&MOV bank while neglecting the shunt capacitances of the line, $\Delta \underline{V}_{SC\_i}^{SUB\_A} = \underline{V}_{Bi} - \underline{V}_{Ai}e^{j\delta_A} - \underline{Z}_{iL}\underline{I}_{Bi} + d_A(\underline{Z}_{iL}\underline{I}_{Ai}e^{j\delta_A} + \underline{Z}_{iL}\underline{I}_{Bi})$ denotes the i-th symmetrical component of voltage drop across the SCs&MOVs, $\underline{I}_{SC\_i}^{SUB\_A} = \underline{I}_{Bi}$ denotes i-th symmetrical component of current entering the SC&MOV bank, while neglecting the shunt capacitances of the line, $\underline{a}_1$, $\underline{a}_2$, $\underline{a}_0$ are complex coefficients that depend on fault type and are selected by case type:

in a single-phase to ground fault, the faulted phase, for example, for a phase 'a' to ground fault the equivalent impedance of SC&MOV in phase 'a' is determined and in an inter-phase fault, any of the faulted phases, for example, for a phase 'a' to phase 'b' fault, the equivalent impedance of SC&MOV in phase 'a' is determined, next, an-equivalent impedance of SC&MOV at pre-fault ($Z_{SC1\_pre}$) is calculated from the equation:

$$Z_{SC1\_pre} = \frac{\Delta V_{SC1}^{pre}}{I_{SC1\_B}^{pre}}$$

where:

$$\Delta V_{SC1}^{pre} = V_{SC1\_B}^{pre} - V_{SC1\_A}^{pre} e^{j\delta A},$$

$$V_{SC1\_A}^{pre} = \cosh(\underline{\gamma}_{1L} p_{SC} l) \cdot \underline{V}_{A1}^{pre} - \underline{Z}_{c1L} \sinh(\underline{\gamma}_{1L} p_{SC} l) \cdot \underline{I}_{A1}^{pre},$$

$$V_{SC1\_B}^{pre} = \cosh(\underline{\gamma}_{1L}(1-p_{SC})l) \cdot \underline{V}_{B1}^{pre} - \underline{Z}_{c1L} \sinh(\underline{\gamma}_{1L}(1-p_{SC})l) \cdot \underline{I}_{B1}^{pre},$$

$$I_{SC1\_B}^{pre} = -\frac{1}{\underline{Z}_{c1L}} \sinh(\underline{\gamma}_{1L}(1-p_{SC})l) \cdot \underline{V}_{B1}^{pre} + \cosh(\underline{\gamma}_{1L}(1-p_{SC})l) \cdot \underline{I}_{B1}^{pre},$$

in which:
$Z_{c1L}$ denotes the characteristic impedance of the line for the positive sequence, and
$\underline{\gamma}_{1L}$ denotes the propagation constant of the line for the positive sequence, in order to determine the final result ($d_A$) which is chosen in the following steps:
first, check whether the fault resistances ($R_{FA}$) is of positive value and if not, then subroutine I is rejected,
next, features "real" and "imag" of the estimated equivalent circuit, ($\underline{Z}_{SC1\_ph}^{SUB\_A}$), of the SC&MOV is checked for the following dependency:
real($\underline{Z}_{SC1\_ph}^{SUB\_A}$)>0,
imag($\underline{Z}_{SC1\_ph}^{SUB\_A}$)<0,
and imag($\underline{Z}_{SC1\_ph}^{SUB\_A}$)>imag($\underline{Z}_{SC1\_pre}$)
and if the above dependency is met, then it is determined that the fault has occurred between the station A and the SC&MOV and the result ($d_A$) indicates the distance to fault, and the information about the real fault case is supplied to fault locator FL,
wherein subroutine II comprises the following steps:
(B1.) determining a synchronization angle ($\delta_B$) in term ($e^{j\delta_B}$) for a known type of fault which is phase-to-ground faults or phase-to-phase faults from the formula:

$$[e^{j\delta_B}]_{ph-g,ph-ph} = \frac{a_{F2}^{I-SET} \underline{I}_{SC2\_A} - a_{F1}^{II-SET} \underline{I}_{SC1\_A}}{a_{F1}^{II-SET} \underline{N}_{B1} - a_{F2}^{I-SET} \underline{N}_{B2}}$$

where:
$\underline{a}_{F2}^{I-SET}$, $\underline{a}_{F1}^{II-SET}$—denote coefficients dependent of fault type,
$\underline{I}_{SC1\_A}$—denotes positive sequence current from the station A after analytical transfer towards the SC&MOV,
$\underline{I}_{SC2\_A}$—denotes negative sequence current from the station A after analytical transfer towards the SC&MOV,
$\underline{N}_{B1}$, $\underline{N}_{B2}$—denote coefficients dependent on positive and negative sequence currents and voltage taken at station B respectively as well as parameters of the one or more power transmission lines, and
for faults not being the phase-to-ground faults or phase-to-phase faults from the formula:

$$e^{-j\delta_B} = \frac{(1+\underline{Z}_{1B}\underline{Y}_{1B})(\underline{Y}_{1B}\underline{V}_{B1}^{pre} - \underline{I}_{B1}^{pre}) + \underline{Y}_{1B}\underline{V}_{B1}^{pre}}{(1+\underline{Z}_{1A}\underline{Y}_{1A})(\underline{I}_{A1}^{pre} - \underline{Y}_{1A}\underline{V}_{A1}^{pre}) - \underline{Y}_{1A}\underline{V}_{A1}^{pre}}$$

where:
$V_{A1}^{pre}$, $V_{B1}^{pre}$—denote pre-fault positive sequence quantities of voltage measured at the ends A and B, respectively, $\underline{I}_{A1}^{pre}$, $\underline{I}_{B1}^{pre}$—denote pre-fault positive sequence quantities of current measured of the faulted one or more power transmission lines at the ends A and B, respectively,
$\underline{Z}_{1A}$, $\underline{Y}_{1A}$—denote impedance and admittance, respectively, of line section LA,
$\underline{Z}_{1B}$, $\underline{Y}_{1B}$—denote impedance and admittance, respectively, of line section LB,
(B2.) then taking into account the distributed parameter line model and solving the formula:

$$d_B = (1-p_{SC})d_{LB}$$

where:
$(1-p_{SC})$—denotes a distance (p.u.) per unit of total line length l, at which the SC&MOV is installed in the transmission line from the station B,
$d_{LB}$—denotes a hypothetical distance to fault, expressed in relation to length $(1-p_{SC})l$ and which value is received using known iterative method by solving the fault loop formula:

$$\sum_{i=0}^{2} a_i(\underline{V}_{Bi} \cosh(\underline{\gamma}_{iL} d_{LB}(1-p_{SC})l) - \underline{Z}_{ciL} \underline{I}_{Bi} \sinh(\underline{\gamma}_{iL} d_{LB}(1-p_{SC})l)) \cdot e^{j\delta_B} -$$

$$R_{FB} \sum_{i=1}^{2} \frac{a_{Fi} M_i}{\cosh(\underline{\gamma}_{iL}(1-d_{LB})(1-p_{SC})l)} = 0$$

for single line, $$\sum_{i=0}^{2} a_i(\underline{V}_{Bi} \cosh(\underline{\gamma}_{iL} d_{LB}(1-p_{SC})l) - \underline{Z}_{ciL} \underline{I}_{Bi} \sinh(\underline{\gamma}_{iL} d_{LB}(1-p_{SC})l)) \cdot e^{j\delta_B} -$$

$$R_{FB} \sum_{i=1}^{2} \frac{a_{Fi} M_i}{\cosh(\underline{\gamma}_{iL}(1-d_{LB})(1-p_{SC})l)} -$$

$$a_{m0} d_{LB}(1-p_{SC}) \underline{Z}_{0m} \underline{I}_{Bparal\_0} \cdot e^{j\delta_B} = 0$$

for double-circuit line
where:
$V_{Bi}$ denotes the zero, positive and negative sequence of voltage, respectively, measured at the end A, and wherein i=0, 1, 2 denotes the i-th symmetrical component,
$\underline{Z}_{ciL}$ denotes the zero, positive and negative sequence of line impedance, respectively, and wherein i=0, 1, 2 denotes the i-th symmetrical component,
$\underline{I}_{Bi}$ denotes the zero, positive, and negative sequence currents measured at the end A, respectively, and where i=0, 1, 2 denotes the i-th symmetrical component,
$\underline{\gamma}_{iL}$ denotes the zero, positive, and negative sequence of line admittance, respectively, and wherein i=0, 1, 2 denotes the i-th symmetrical component,
$R_{FB}$—denotes an unknown fault resistance, which a value is received using known iterative method by solving the fault loop formula above,
$M_i$—denote numerical coefficients for positive and negative sequences,
$a_1$, $a_2$, $a_0$, $a_{m0}$—denotes weighting coefficients dependent on fault type,
$a_{F0}$, $a_{F1}$, $a_{F2}$—denotes share coefficients dependent on fault type, $Z_{0m}$—mutual coupling impedance for zero sequence,
$\underline{I}_{Bparal\_0}$—denotes zero sequence current from the station B measured in a healthy parallel line, (B3.) then an equivalent impedance of the SC&MOV at fault stage ($Z_{SC1\_ph}^{SUB\_B}$) is calculated using post fault measured voltage and currents from the equation:

$$Z_{SC1\_ph}^{SUB\_B} = \frac{\Delta \underline{V}_{SC\_ph}^{SUB\_B}}{\underline{I}_{SC\_ph}^{SUB\_B}}$$

and an equivalent impedance of SC&MOV bank at pre-fault ($Z_{SC1\_pre}$) is calculated from the equation:

$$Z_{SC1\_pre} = \frac{\Delta \underline{V}_{SC1}^{pre}}{\underline{I}_{SC1\_B}^{pre}}$$

where:

$\Delta \underline{V}_{SC1}^{pre} = \underline{V}_{SC1\_B}^{pre} - \underline{V}_{SC1\_A}^{pre} e^{j\delta A}$, $\underline{V}_{SC1\_A}^{pre} = \cosh(\underline{\gamma}_{1L} p_{SC} l) \cdot \underline{V}_{A1}^{pre} - \underline{Z}_{c1L} \sinh(\underline{\gamma}_{1L} p_{SC} l) \cdot \underline{I}_{A1}^{pre}$, $\underline{V}_{SC1\_B}^{pre} = \cosh(\underline{\gamma}_{1L}(1 - p_{SC})l) \cdot \underline{V}_{B1}^{pre} - \underline{Z}_{c1L} \sinh(\underline{\gamma}_{1L}(1 - p_{SC})l) \cdot \underline{I}_{B1}^{pre}$, -continued $\underline{I}_{SC1\_B}^{pre} = -\frac{1}{\underline{Z}_{c1L}} \sinh(\underline{\gamma}_{1L}(1 - p_{SC})l) \cdot \underline{V}_{B1}^{pre} + \cosh(\underline{\gamma}_{1L}(1 - p_{SC})l) \cdot \underline{I}_{B1}^{pre}$, $Zc1L$ denotes the characteristic impedance of the line for the positive sequence, $\underline{\gamma}_{1L}$ denotes the propagation constant of the line for the positive sequence, in order to determine the final result ($d_B$) which is chosen in the following steps:

first, check whether the fault resistances ($R_{FB}$) is of positive value and if not, then subroutine II is rejected, next, features "real" and "imag" of the estimated equivalent circuit of the SC&MOV is checked for the following dependence:

real($Z_{SC1\_ph}^{SUB\_B}$)>0,
imag($Z_{SC1\_ph}^{SUB\_B}$)<0
and imag($Z_{SC1\_ph}^{SUB\_B}$)>imag($Z_{SC1\_pre}$), then it is determined that the fault has occurred between the station (B) and the SC&MOV and the result ($d_B$) indicates the distance to fault, and the information about the real fault case is supplied to fault locator FL.

2. A protection relay equipped with a fault locator comprising means for performing the steps of claim 1.

\* \* \* \* \*